US012675432B2

(12) United States Patent
Zhang et al.

(10) Patent No.: US 12,675,432 B2
(45) Date of Patent: Jul. 7, 2026

(54) COMPUTING-IN-MEMORY CIRCUIT, CHIP AND ELECTRONIC DEVICE

(71) Applicant: INSTITUTE OF MICROELECTRONICS OF THE CHINESE ACADEMY OF SCIENCES, Beijing (CN)

(72) Inventors: Feng Zhang, Beijing (CN); Hao Wu, Beijing (CN)

(73) Assignee: INSTITUTE OF MICROELECTRONICS OF THE CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 18/995,557

(22) PCT Filed: Dec. 19, 2022

(86) PCT No.: PCT/CN2022/140010
§ 371 (c)(1),
(2) Date: Jan. 16, 2025

(87) PCT Pub. No.: WO2024/103480
PCT Pub. Date: May 23, 2024

(65) Prior Publication Data
US 2026/0017227 A1      Jan. 15, 2026

(30) Foreign Application Priority Data
Nov. 14, 2022    (CN) .......................... 202211418678.2

(51) Int. Cl.
*G06F 15/78* (2006.01)
*G11C 13/00* (2006.01)
*H03M 1/12* (2006.01)

(52) U.S. Cl.
CPC ........ *G06F 15/7821* (2013.01); *G11C 13/004* (2013.01); *G11C 13/0069* (2013.01); *H03M 1/12* (2013.01)

(58) Field of Classification Search
None
See application file for complete search history.

(56) References Cited

U.S. PATENT DOCUMENTS 11,893,271 B2 * 2/2024 Zhang ..................... G11C 11/54
2020/0279012 A1 * 9/2020 Khaddam-Aljameh .....................
G06G 7/22
(Continued)

FOREIGN PATENT DOCUMENTS

CN        106847335 A      6/2017
CN        108270420 A      7/2018
(Continued)

OTHER PUBLICATIONS

International Search Report with English translation for PCT/CN2022/140010 dated Dec. 19, 2022, 6 pages.

*Primary Examiner* — Michael Sun
(74) *Attorney, Agent, or Firm* — SYNCODA LLC; Feng Ma

(57) ABSTRACT

The present application discloses a computing-in-memory circuit, chip and electronic device, wherein the computing-in-memory circuit comprises: a resistive random access memory array, a clamping circuit, a current mirror and an analog-to-digital conversion circuit; the clamping circuit is connected between a signal input terminal and the resistive random access memory array, configured to input clamping voltage signal to the N resistive random access memories selected of the resistive random access memory array, wherein N is an integer and N≥2; the current mirror is connected between the resistive random access memory array and the analog-to-digital conversion circuit, config- (Continued)

ured to output convergence current to the analog-to-digital conversion circuit based on the N-way currents output from the N resistive random access memories selected; the analog-to-digital conversion circuit configured to convert the convergence current to a digital signal.

17 Claims, 3 Drawing Sheets

(56)                    References Cited

U.S. PATENT DOCUMENTS

| | | | |
|---|---|---|---|
| 2022/0068380 A1 | 3/2022 | Carissimi et al. | |
| 2022/0309328 A1* | 9/2022 | Saxena | ................. G06F 7/5443 |

FOREIGN PATENT DOCUMENTS

| | | | |
|---|---|---|---|
| CN | 111653299 A | 9/2020 |
| CN | 111985607 A | 11/2020 |
| CN | 113625034 A | 11/2021 |
| CN | 114389612 A | 4/2022 |

* cited by examiner

COMPUTING-IN-MEMORY CIRCUIT, CHIP AND ELECTRONIC DEVICE

CROSS-REFERENCE TO RELATED APPLICATIONS

This application claims priority to Chinese Patent Application No. 202211418678.2, filed on Nov. 14, 2022 and International Patent Application No. PCT/CN2022/140010, filed on Dec. 19, 2022, and entitled "computing-in-memory circuit, chip and electronic device", both of which are hereby incorporated by reference in their entireties.

TECHNICAL FIELD

The present application relates to a computing-in-memory circuit, chip and electronic device.

BACKGROUND

As difference between the improvement of processor and memory technologies gets larger, the "memory wall" scissors gap under the von Neumann architecture is continually increasing, the issue of memory access power wall is also becoming more and more prominent. Therefore, both industry and academia are beginning to shift from focusing on computation to focusing on storage. At the same time, with the gradual maturation and implementation of various machine learning algorithms at present, an increasing number of algorithms based on artificial neural networks are deployed in various scenarios to perform tasks such as intelligent classification or intelligent recognition. However, rapidly grows in the computation volume, along with the issues like slow data transfer in memory and high energy consumption during data transfer etc., have become one of the critical bottlenecks affecting computational efficiency.

SUMMARY

The technical problem of high energy consumption during data transfer in memory due to memory wall and power wall is solved by utilizing one or more embodiments of the present application.

In the first aspect, the present application provides a computing-in-memory circuit, wherein the circuit comprises: a resistive random access memory array, a clamping circuit, a current mirror and an analog-to-digital conversion circuit; the clamping circuit is connected between a signal input terminal and the resistive random access memory array, configured to input clamping voltage signal to N resistive random access memories selected in the resistive random access memory array, wherein Nis an integer and N≥2; the current mirror is connected between the resistive random access memory array and the analog-to-digital conversion circuit, configured to output convergence current to the analog-to-digital conversion circuit based on the N-way currents output from the N resistive random access memories selected; the analog-to-digital conversion circuit configured to convert the convergence current to a digital signal.

In the second aspect, the present application provides a computing-in-memory chip, which comprises any of the computing-in-memory circuit provided in the first aspect.

In the third aspect, this present application provides an electronic device, which comprises the computing-in-memory chip provided in the second aspect.

The present application provides a computing-in-memory circuit. In one aspect, basic data reading and writing operations can be implemented by utilizing the resistive random access memory (RRAM) array; in the other aspect, the different readout voltages can be clamped at the two ends of the resistive random access memory via the clamping circuit, in combination with the high or low impedance state of the N resistive random access memories selected in the resistive random access memory array, N-way current signals are output; the N-way currents output the convergence current or integrated current after assignment value processing through the current mirror, the convergence current is then converted to a digital signal through the analog-to-digital conversion circuit, thus achieving multiplication between the input data and the corresponding data of the N resistive random access memories selected; the computing-in-memory circuit performs computation during data readout by utilizing the characteristics of the resistive random access memory array suitable for current-type computation, integrates computing and storing functions through a computing-in-memory design, computation can be performed during data readout, avoided the high switching power consumption in traditional digital circuit multiplier calculation; meanwhile, the clamping circuit clamps the input signal, and the clamping voltage is converted into a current signal through the resistive random access memory array. The output current is read out as a digital signal through the current mirror and the analog-to-digital conversion circuit. Therefore, there is only one conversion from voltage to current during computation, the current signal is not additionally converted back to a voltage signal for readout, reduced the extra circuit overhead caused by current-to-voltage conversion, thereby improving computation speed and reducing the computational power consumption of the circuit and system.

The above description is merely an overview of the technical solution provided in the present application. To gain a clearer understanding of the technical means of the present application and to facilitate its implementation according to the contents of the specification, as well as to make the above and other purposes, features and advantages of the present application more apparent and easily understood, detailed embodiments of the present application are provided below.

DESCRIPTION OF THE APPENDED DRAWING REFERENCE SIGNS

Figure 1:
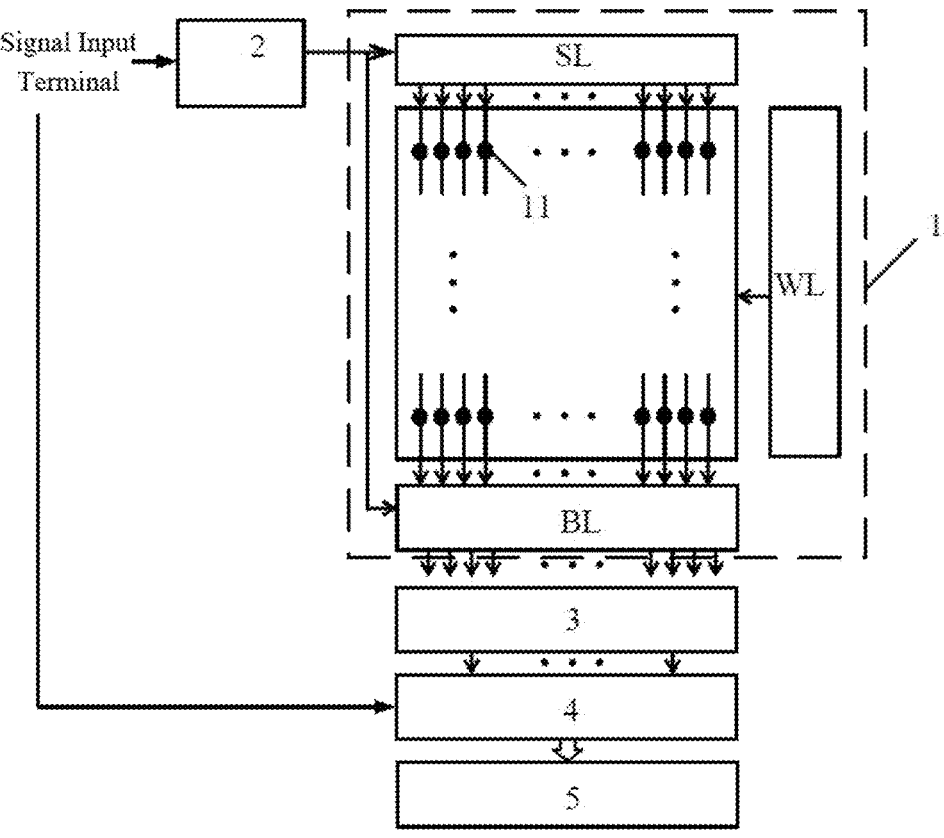
FIG. 1 is an overall schematic diagram of the computing-in-memory circuit of an embodiment of the present application.

1: resistive random access memory array; 11: memory unit; SL: source line; WL: word line; BL: bit line; T1: first transistor; R: resistive random access memory; 2: clamping circuit; 21: operational amplifier; T2: second transistor; 3: current mirror; 4: analog-to-digital conversion circuit; T3: third transistor; T4: fourth transistor; 41: first inverter; 42: second inverter; 43: third inverter; T11: first pull-up transistor; T12: first pull-down transistor; T21: second pull-up transistor; T22:

second pull-down transistor; T31: third pull-up transistor; T32: third pull-down transistor; 5: digital combined circuit.

DESCRIPTION OF EMBODIMENTS

In order to enable those skilled in the relevant art to understand the present application more clearly, the technical solutions of the present application will be particularly described below via detailed embodiments by referring to the drawings. In the entire specification, unless otherwise particularly specified, the terms used in the present application should be understood to have the meanings commonly used in the art. Therefore, unless otherwise defined, all technical and scientific terms used in the present application have the same meanings generally understood by those skilled in the relevant art. If there is a contradiction, the specification takes precedence. Unless otherwise particularly specified, the various devices etc. used in the present application can all be obtained through market purchase or creating using existing methods.

With the continuous development of storage technology, computing-in-memory (CIM) involves embedding computational capabilities within memory to perform two-dimensional and three-dimensional matrix multiplication/addition using a new computational architecture. Because computing-in-memory technology directly utilizes memory for data processing or computation, it integrates data storage and computation within the same area of the same chip, theoretically eliminating the von Neumann computation architecture bottleneck entirely. This is particularly suitable for application scenario with large data volumes and extensive scale, such as deep learning neural networks. However, current CIM chips or memories have certain limitations in power consumption, restricted their application in machine learning, especially in weight computation of artificial neural networks.

In the first aspect, as shown in FIG. 1, the present application provides a computing-in-memory circuit, which comprises: a resistive random access memory array 1, a clamping circuit 2, a current mirror 3, and an analog-to-digital conversion circuit 4; the clamping circuit 2 is connected between a signal input terminal and the resistive random access memory array 1, configured to input clamping voltage signal to the N resistive random access memories selected of the resistive random access memory array 1, wherein N is an integer and N≥2; the current mirror 3 is connected between the resistive random access memory array 1 and the analog-to-digital conversion circuit 4, configured to output convergence current to the analog-to-digital conversion circuit 4 based on the N-way currents from the N resistive random access memories R selected; the analog-to-digital conversion circuit 4 configured to convert the convergence current to a digital signal.

The computing-in-memory circuit provided in the embodiment, in one aspect, basic data reading and writing operations can be implemented by utilizing the resistive random access memory (RRAM) array; in the other aspect, the different readout voltages can be clamped at the both ends of the resistive random access memory R via the clamping circuit 2, in combination with the high or low impedance state of the N resistive random access memories selected of the resistive random access memory array 1, outputting N-way current signals; the N-way currents output the convergence current or integrated current after assignment value processing through the current mirror 3, the convergence current is then converted to a digital signal through the analog-to-digital conversion circuit 4, thus achieving multiplication between the input data and the corresponding data of the N resistive random access memories selected; the computing-in-memory circuit performs computation during data readout by utilizing the characteristics of the resistive random access memory array 1 suitable for current-type computation, integrates computing and storing functions through a computing-in-memory design, computation can be performed during data readout, avoided the high switching power consumption in traditional digital circuit multiplier calculation; meanwhile, the clamping circuit 2 clamps the input signal, and the clamping voltage is converted into a current signal through the resistive random access memory array 1. The output current is read out as a digital signal through the current mirror 3 and the analog-to-digital conversion circuit 4. Therefore, there is only one conversion from voltage to current during computation, the current signal is not additionally converted back to a voltage signal for readout, reduced the extra circuit overhead caused by current-to-voltage conversion, thereby improving computation speed and reducing the computational power consumption of the circuit and system.

Specifically, the resistive random access memory array 1 is a storage array composed of resistive random access memories, which comprises a plurality of memory units 11 and connected source line SL (Source Line), word line WL (Word Line) and bit line BL (Bit Line), performing basic data reading and writing functions in combination with an address decoder and control circuit. Wherein the address decoder is connected between the signal input terminal and the resistive random access memory array 1.

Figure 2:
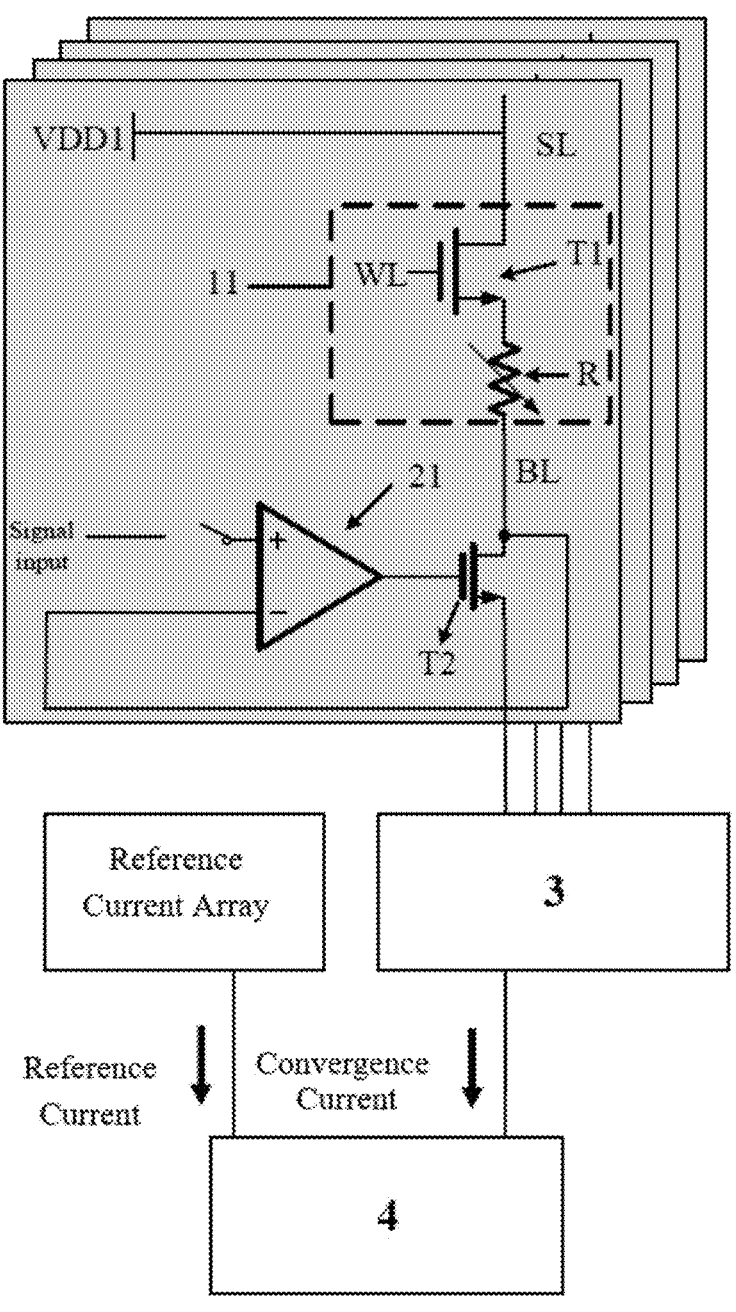
FIG. 2 is a schematic diagram of the clamping voltage and a memory unit structure of an embodiment of the present application.

In order to reduce the area and power consumption of the computing-in-memory circuit as far as possible, the embodiment uses a 1T1R memory unit, that is, a memory unit 11 consists of one resistive random access memory (R) and one transistor (T). FIG. 2 illustrates the structure of the 1T1R memory unit and the connected clamping circuit 2 provided by the embodiment. In some embodiments, a memory unit 11 comprises a first transistor T1 and a resistive random access memory R; the source of the first transistor T1 is connected to the source line SL, the gate thereof is connected to the word line WL; the resistive random access memory R is connected between the drain of the first transistor T1 and the clamping circuit 2.

The function of the clamping circuit 2 is to clamp the different readout voltages at two ends of the RRAM based on the input signal from the signal input terminal. The input signal comprises two kinds of signals, one is the memory address signal, which selects N resistive random access memories R on a specific word line WL in the resistive random access memory array 1 after being converted by the address decoder, thus determining the data or weight stored in the resistive random access memory array 1; the other is the data signal used for performing computation with the data or weight in the resistive random access memory array 1, which is converted into clamping voltage or readout voltage via the clamping circuit 2, and applied to the resistive random access memory R selected, causing the N resistive random access memories R selected to output N-way currents. The N-way currents are then converted to a digital signal through the current mirror 3 and the analog-to-digital conversion circuit 4 to complete the multiplication between the input data and the stored data in the resistive random access memory R.

FIG. 2 illustrates the schematic structure of the clamping circuit 2 structure in conjunction with the 1T1R memory unit provided in the embodiment, the number of the clamping circuit 2 is equal to the number of the memory unit 11; one clamping circuit 2 is connected between the signal input terminal and one memory unit 11; in some embodiments, the clamping circuit 2 comprises an operational amplifier 21 and a second transistor T2; the positive input terminal of the operational amplifier 21 is connected to the signal input terminal, the inverting input thereof is connected to the bit line BL, and the output terminal thereof is connected to the gate of the second transistor T2; the source of the second transistor T2 is connected to the bit line BL, the drain thereof is connected to the current mirror 3.

In some embodiments, for the different input signals, the clamping circuit 2 clamps the corresponding readout voltages at two ends of the resistive random access memory R through the operational amplifier 21. FIG. 2 shows four different signal inputs, corresponding to four different clamping voltages or readout voltages: V0, V1, V2 and V3, which can be mapped using a two-bit binary encoding:00, 01, 10, 11; the number of bits of the clamping voltage signal can be determined on demand and is not limited to two-bit signals. The clamping circuit 2 further comprises a power source or potential VDD1 connected to the bit line BL, thereby cooperating with the operational amplifier 21 and the second transistor T2 to clamp the voltage at two ends of the first transistor T1; thus, the clamping circuit 2 provided in the embodiment ensures that memory unit 11 requires to set only one transistor, that is, the first transistor T1 can generate a stable current. An extra transistor no need be added in the memory unit 11, the second transistor T2 in the clamping circuit 2 can be directly used to generate a stable result current, thereby reducing the circuit area of the resistive random access memory array 1 significantly, enhancing computational capability, or resulting in lower power consumption and higher computational efficiency under the same computational capability condition.

The N resistive random access memories R selected output N-way currents to the current mirror 3 under the clamping voltage input. The current mirror 3, also known as mirror constant current source, configured to ensure that the controlled current is equal to the input reference current. In the embodiment, the current mirror 3 configured to combine the N-way output currents into a single convergence current, which is then outputted to the analog-to-digital conversion circuit 4.

In some embodiments, the analog-to-digital conversion circuit 4 may be a current-type successive approximation analog-to-digital conversion circuit. The basic principle of a current-type successive approximation analog-to-digital converter is to use a series of reference currents to implement binary search algorithm by performing comparison operations, converting the current analog signal to a digital signal. The series of reference currents can be generated by a reference current array.

Figure 3:
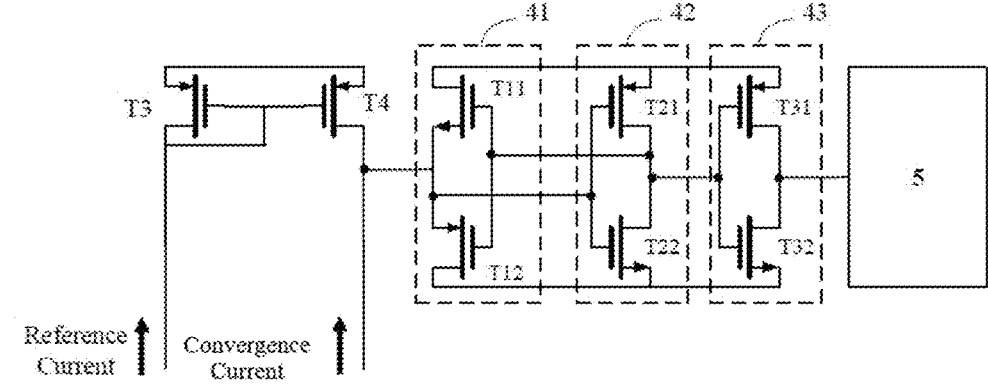
FIG. 3 is a schematic diagram of the current-type successive approximation analog-to-digital conversion circuit structure of an embodiment of the present application.

In some embodiments, as shown in FIG. 3, the current-type successive approximation analog-to-digital conversion circuit comprises: a third transistor T3, a fourth transistor T4, a first inverter 41, a second inverter 42 and a third inverter 43; wherein the drain of the third transistor T3 is connected to the reference current array, the source thereof is connected to the source of the fourth transistor T4, the gate thereof is connected to the gate of the fourth transistor T4; the drain of the fourth transistor T4 is connected to the current mirror 3; the output terminal of the first inverter 41 and the input terminal of the second inverter 42 are connected to the drain of the fourth transistor T4; the input terminal of the first inverter 41 and the output terminal of the second inverter 42 are connected to the input terminal of the third inverter 43.

In some embodiments, the current-type successive approximation analog-to-digital conversion circuit directly performs comparison and readout bit by bit of the convergence current result output from the resistive random access memory array 1, the current signal need not be additionally converted back to voltage, thereby reducing the extra circuit overhead caused by current-to-voltage conversion and eliminating errors introduced by signal conversion. Meanwhile, common analog-to-digital conversion circuit sets capacitor which converts current to voltage by charging and discharging the capacitor with current, while the long charging and discharging time will lead to reduce the circuit performance. The current-type successive approximation analog-to-digital conversion circuit provided in the embodiment forms a comparator with bistable structure through the first inverter 41 and the second inverter 42, resulting in fast and stable read out current result. It offers certain advantages in circuit area, result accuracy and speed performance.

The detailed connection structure of the inverter is shown in FIG. 3, specifically comprises: the first inverter 41 comprises a first pull-up transistor T11 and a first pull-down transistor T12, the second inverter 42 comprises a second pull-up transistor T21 and a second pull-down transistor T22, the third inverter 43 comprises a third pull-up transistor T31 and a third pull-down transistor T32; the drain of the first pull-up transistor T11, the source of the second pull-up transistor T21 and the source of the third pull-up transistor T31 are connected to the power supply VDD2; the drain of the first pull-down transistor T12, the source of the second pull-down transistor T22 and the source of the third pull-down transistor T32 are grounded; the source of the first pull-up transistor T11 is connected to the source of the first pull-down transistor T12, the gate of the first pull-up transistor T11 is connected to the gate of the first pull-down transistor T12; the gate of the second pull-up transistor T21 is connected to the gate of the second pull-down transistor T22, the drain of the second pull-up transistor T21 is connected to the drain of the second pull-down transistor T22; the gate of the third pull-up transistor T31 is connected to the gate of the third pull-down transistor T32, the drain of the third pull-up transistor T31 is connected to the drain of the third pull-down transistor T32.

Wherein: the connection part between the source of the first pull-up transistor T11 and the source of the first pull-down transistor T12 forms the output terminal of the first inverter 41, the connection part between the gate of the first pull-up transistor T11 and the gate of the first pull-down transistor T12 forms the input terminal of the first inverter 41; the connection part between the drain of the second pull-up transistor T21 and the drain of the second pull-down transistor T22 forms the output terminal of the second inverter 42, the connection part between the gate of the second pull-up transistor T21 and the gate of the second pull-down transistor T22 forms the input terminal of the second inverter 42; the connection part between the drain of the third pull-up transistor T31 and the drain of the third pull-down transistor T32 forms the output terminal of the third inverter 43, the connection part between the gate of the third pull-up transistor T31 and the gate of the third pull-down transistor T32 forms the input terminal of the third inverter 43.

In some embodiments, the computing-in-memory circuit further comprises a digital combined circuit 5, the input terminal of the digital combined circuit 5 is connected to the output terminal of the third inverter 43, configured to convert the digital signal to a target encoding. The target encoding is a coding signal suitable for processing by the next stage circuit or device.

The transistors in the above circuit structure can be field effect transistor.

Next, the working process of the computing-in-memory circuit will be described in combination with an example of the application of the computing-in-memory circuit for weight multiplication in artificial neural networks. In the application scenario, the resistive random access memory array 1 is 1024 words×64 bits, each memory unit 11 uses a 1T1R structure, the storage of 0 and 1 achieves by the high or low resistance of the resistive random access memory R, the resistive random access memory array 1 stores the weight matrix required by the artificial neural network. The computing-in-memory circuit can support up to two 8-bit× 8-bit multiplication calculation simultaneously, wherein one 8-bit data is stored in the resistive random access memory array 1, thereby selecting 8 resistive random access memories R on a specific word line WL via the address decoder to determine the weights involved in the computation; another 8-bit data is input 4 times from the signal input terminal, such as a Computer Input Media (CIM) in 2-bit encoded form (00, 01, 10, 11), applied to the 8 resistive random access memories selected after converting to the readout voltage through the clamping circuit 2. After the 4 times inputs are completed, the resistive random access memory array 1 outputs the complete 8-bit×8-bit computation result. For a 2-bit×4-bit multiplication calculation, the computing-in-memory circuit can achieve parallel computing-in-memory calculation up to 16 inputs and 16 outputs simultaneously.

Taking the 2-bit×4-bit multiplication calculation as an example: the 4 bits represent signed weights in the resistive random access memory array 1. Four resistive random access memory R in a word need to be selected, wherein the first resistive random access memory R stores the sign bit, e.g. a high resistance state indicates 0, representing that the weight is a positive weight, a low resistance state indicates 1, representing that the weight is a negative weight; the remaining 3 resistive random access memories R store the weight values. The 2 bits are input signals from the signal input terminal, the clamping circuit 2 converts them into corresponding multiple of clamping voltages according to the input encoding of the 2 bits and applies to at two ends of the resistive random access memory R. Wherein the corresponding multiple can be determined based on actual requirements, an example of mapping relationship is shown in Table 1.

TABLE 1

| Clamp voltage based on 2-bit inputs | | | |
| --- | --- | --- | --- |
| 2-bit inputs | | | |
| 00 | 01 | 10 | 11 |
| clamp voltage 0 | 100 MV~181 MV | 100 MV~270 MV | 100 MV~357 MV |

After the clamping voltage is applied to the resistive random access memory R selected, then converges in the current mirror 3, the convergence current is output, the current-type successive approximation analog-to-digital conversion circuit (ADC) converts it into a digital coding to output according to the convergence current value and the reference current value. An example of the conversion is shown in Table 2.

TABLE 2

| | | Calculation example | | |
| --- | --- | --- | --- | --- |
| 2-bit inputs | clamp voltage/MV | convergence current/μA | reference current/μA | ADC output code value binary (decimal) |
| 01 | 100~181 | 1.538 | | 0(0) |
| | | 3.349 | 2.4435 | 1(1) |
| | | 5.152 | 4.2505 | 10(2) |
| | | 6.949 | 6.0505 | 11(3) |
| | | 8.741 | 7.8450 | 100(4) |
| | | 10.530 | 9.6355 | 101(5) |
| | | 12.315 | 11.4225 | 110(6) |
| | | 14.098 | 13.2065 | 111(7) |
| 10 | 100~270 | 3.034 | | 0(0) |
| | | 6.611 | 4.8255 | 10(2) |
| | | 10.169 | 8.3900 | 100(4) |
| | | 13.714 | 11.9550 | 110(6) |
| | | 17.249 | 15.4515 | 1000(8) |
| | | 20.775 | 19.0120 | 1010(10) |
| | | 24.293 | 22.5340 | 1100(12) |
| | | 27.804 | 26.0485 | 1110(14) |
| 11 | 100~357 | 4.525 | | 0(0) |
| | | 9.858 | 7.1915 | 11(3) |
| | | 15.161 | 12.5095 | 110(6) |
| | | 20.443 | 17.8020 | 1001(9) |
| | | 25.708 | 23.0755 | 1100(12) |
| | | 30.957 | 28.3325 | 1111(15) |
| | | 36.193 | 33.5750 | 10010(18) |
| | | 41.418 | 38.8055 | 10101(21) |

After receiving the code values output by the current-type successive approximation analog-to-digital conversion circuit, the digital combined circuit 5 can encode the output code values into target coding which are convenient for the subsequent processing through complement arithmetic. For example, if the ADC outputs the code value 111 with a sign bit of 0 (indicating a positive number), it can be obtained by positive binary complement: 000111 representing complement; if the ADC outputs the code value 111 with a sign bit of 1 (indicating a negative number), it can be obtained by negative binary complement: 111001 representing complement.

The above process illustrates the calculation process of a 2-bit×4-bit signed weights. For an 8-bit×8-bit operation, such as 10101010×11111111, it can be broken down into 2-bit inputs at four times: (11)(11)(11)(11) and 4-bit weights at two times: (1010)(1010). Then the final computational result of 10101010×11111111 is obtained using bit-shifting, addition and concatenation operations of the digital circuit based on the computational result of (1010)×(11).

Therefore, the computing-in-memory circuit provided by the embodiment can achieve multiplication operation results with 2 to 8 bits inputs and 4 to 8 bits signed weights. Moreover, the precisions of the input data and weight data can be flexibly adjusted as needed. The principle of above design is the light weight processing of various neural network algorithms widely deployed at the edge terminal currently. The weights of the algorithms are often quantified to 4 or 8 bits, thus the above computing-in-memory circuit design can be widely applied to the computing systems deployed at the low power consumption edge scenarios.

In summary, the embodiment provides a computing-in-memory circuit that performs computation using the particularity of the resistive random access memory array and integrates computing and storing functions based on a computing-in-memory design. Computation can be performed during data readout, decreasing the power consumption of the circuit and system as far as possible, thus saving power consumption and time delay caused by data transferring of the intelligent devices at the edge significantly, meeting the low latency, low power consumption and distributed requirements of edge intelligent devices.

In the second aspect, the present application provides a computing-in-memory chip, which comprises any of the computing-in-memory circuit provided in the first aspect.

In the third aspect, this present application provides an electronic device, which comprises the computing-in-memory chip provided in the second aspect.

The present application achieves the following beneficial effects or advantages through one or more embodiments of the present application.

The present application provides a computing-in-memory circuit, chip and electronic device. In one aspect, basic data reading and writing operations can be implemented by utilizing the resistive random access memory (RRAM) array; in the other aspect, the different readout voltages can be clamped at two ends of the resistive random access memory via the clamping circuit, in combination with the high or low impedance state of the N resistive random access memories selected of the resistive random access memory array, outputting N-way current signals; the N-way currents output the convergence current or integrated current after assignment value processing through the current mirror, the convergence current is then converted to a digital signal through the analog-to-digital conversion circuit, thus achieving multiplication between the input data and the corresponding data of the N resistive random access memories selected; the computing-in-memory circuit performs computation during data readout by utilizing the characteristics of the resistive random access memory array suitable for current-type computation, integrates computing and storing functions through a computing-in-memory design, computation can be performed during data readout, avoided the high switching power consumption in traditional digital circuit multiplier calculation; meanwhile, the clamping circuit clamps the input signal, and the clamping voltage is converted into a current signal through the resistive random access memory array. The output current is read out as a digital signal through the current mirror and the analog-to-digital conversion circuit. Therefore, the current signal is not additionally converted back to a voltage signal for readout during computation, the extra circuit overhead caused by current-to-voltage conversion is reduced, thereby improving computation speed and reducing the computational power consumption of the circuit and system.

Although preferable embodiments of the present application have been described, a person skilled in the art may make other changes and modifications to the embodiments once familiar with the basic inventive concepts. Thus, the appended claims are intended to cover the preferable embodiments and all changes and modifications that fall within the scope of the present application.

Clearly, a person skilled in the art can make various modifications and variations to the present application without departing from its spirit and scope. Therefore, if these modifications and variations fall within the scope of the claims of the present application and their equivalent technologies, the present application is intended to cover such modifications and variations.

What is claimed is:

1. A computing-in-memory circuit, comprises a resistive random access memory array, a clamping circuit, a current mirror and an analog-to-digital conversion circuit;

the clamping circuit is connected between a signal input terminal and the resistive random access memory array, configured to input clamping voltage signal to N resistive random access memories selected of the resistive random access memory array, wherein N is an integer and N≥2;

the current mirror is connected between the resistive random access memory array and the analog-to-digital conversion circuit, configured to output convergence current to the analog-to-digital conversion circuit based on N-way currents output from the N resistive random access memories selected;

the analog-to-digital conversion circuit configured to convert the convergence current to a digital signal.

2. The computing-in-memory circuit according to claim 1, wherein the resistive random access memory array comprises source line, word line, bit line and a plurality of memory units, one memory unit comprises one first transistor and one resistive random access memory;

the source of the first transistor is connected to the source line, the gate thereof is connected to the word line;

the resistive random access memory is connected between the drain of the first transistor and the clamping circuit.

3. The computing-in-memory circuit according to claim 2, wherein the number of the clamping circuit is equal to the number of the memory unit; one clamping circuit is connected between the signal input terminal and one memory unit;

the clamping circuit comprises an operational amplifier and a second transistor; the positive input terminal of the operational amplifier is connected to the signal input terminal, the inverting input terminal thereof is connected to the bit line, and the output terminal thereof is connected to the gate of the second transistor; the source of the second transistor is connected to the bit line, the drain thereof is connected to the current mirror.

4. The computing-in-memory circuit according to claim 1, wherein the analog-to-digital conversion circuit is a current-type successive approximation analog-to-digital conversion circuit.

5. The computing-in-memory circuit according to claim 4, wherein the current-type successive approximation analog-to-digital conversion circuit comprises: a third transistor, a fourth transistor, a first inverter, a second inverter and a third inverter;

the drain of the third transistor is connected to the reference current array, the source thereof is connected to the source of the fourth transistor, the gate thereof is connected to the gate of the fourth transistor; the drain of the fourth transistor is connected to the current mirror;

the output terminal of the first inverter and the input terminal of the second inverter are connected to the drain of the fourth transistor; the input terminal of the first inverter and the output terminal of the second inverter are connected to the input terminal of the third inverter.

6. The computing-in-memory circuit according to claim 5, wherein the first inverter comprises a first pull-up transistor and a first pull-down transistor, the second inverter comprises a second pull-up transistor and a second pull-down transistor, the third inverter comprises a third pull-up transistor and a third pull-down transistor;

the drain of the first pull-up transistor, the source of the second pull-up transistor and the source of the third pull-up transistor are connected to the power supply; the drain of the first pull-down transistor, the source of the second pull-down transistor and the source of the third pull-down transistor are grounded;

the source of the first pull-up transistor is connected to the source of the first pull-down transistor, the gate of the first pull-up transistor is connected to the gate of the first pull-down transistor;

the gate of the second pull-up transistor is connected to the gate of the second pull-down transistor, the drain of the second pull-up transistor is connected to the drain of the second pull-down transistor;

the gate of the third pull-up transistor is connected to the gate of the third pull-down transistor, the drain of the third pull-up transistor is connected to the drain of the third pull-down transistor.

7. The computing-in-memory circuit according to claim 5, further comprising a digital combined circuit, wherein the input terminal of the digital combined circuit is connected to the output terminal of the third inverter, configured to convert the digital signal to a target encoding.

8. The computing-in-memory circuit according to claim 1, further comprising an address decoder, wherein the address decoder is connected between the signal input terminal and the resistive random access memory array.

9. A computing-in-memory chip, comprising a computing-in-memory circuit, the computing-in-memory circuit, comprises a resistive random access memory array, a clamping circuit, a current mirror and an analog-to-digital conversion circuit;

the clamping circuit is connected between a signal input terminal and the resistive random access memory array, configured to input clamping voltage signal to N resistive random access memories selected of the resistive random access memory array, wherein N is an integer and N≥2;

the current mirror is connected between the resistive random access memory array and the analog-to-digital conversion circuit, configured to output convergence current to the analog-to-digital conversion circuit based on N-way currents output from the N resistive random access memories selected;

the analog-to-digital conversion circuit configured to convert the convergence current to a digital signal.

10. An electronic device, comprising the computing-in-memory chip according to claim 9.

11. The computing-in-memory chip according to claim 9, wherein the resistive random access memory array comprises source line, word line, bit line and a plurality of memory units, one memory unit comprises one first transistor and one resistive random access memory;

the source of the first transistor is connected to the source line, the gate thereof is connected to the word line;

the resistive random access memory is connected between the drain of the first transistor and the clamping circuit.

12. The computing-in-memory chip according to claim 10, wherein the number of the clamping circuit is equal to the number of the memory unit; one clamping circuit is connected between the signal input terminal and one memory unit;

the clamping circuit comprises an operational amplifier and a second transistor; the positive input terminal of the operational amplifier is connected to the signal input terminal, the inverting input terminal thereof is connected to the bit line, and the output terminal thereof is connected to the gate of the second transistor; the source of the second transistor is connected to the bit line, the drain thereof is connected to the current mirror.

13. The computing-in-memory chip according to claim 9, wherein the analog-to-digital conversion circuit is a current-type successive approximation analog-to-digital conversion circuit.

14. The computing-in-memory chip according to claim 12, wherein the current-type successive approximation analog-to-digital conversion circuit comprises: a third transistor, a fourth transistor, a first inverter, a second inverter and a third inverter;

the drain of the third transistor is connected to the reference current array, the source thereof is connected to the source of the fourth transistor, the gate thereof is connected to the gate of the fourth transistor; the drain of the fourth transistor is connected to the current mirror;

the output terminal of the first inverter and the input terminal of the second inverter are connected to the drain of the fourth transistor; the input terminal of the first inverter and the output terminal of the second inverter are connected to the input terminal of the third inverter.

15. The computing-in-memory chip according to claim 13, wherein the first inverter comprises a first pull-up transistor and a first pull-down transistor, the second inverter comprises a second pull-up transistor and a second pull-down transistor, the third inverter comprises a third pull-up transistor and a third pull-down transistor;

the drain of the first pull-up transistor, the source of the second pull-up transistor and the source of the third pull-up transistor are connected to the power supply; the drain of the first pull-down transistor, the source of the second pull-down transistor and the source of the third pull-down transistor are grounded;

the source of the first pull-up transistor is connected to the source of the first pull-down transistor, the gate of the first pull-up transistor is connected to the gate of the first pull-down transistor;

the gate of the second pull-up transistor is connected to the gate of the second pull-down transistor, the drain of the second pull-up transistor is connected to the drain of the second pull-down transistor;

the gate of the third pull-up transistor is connected to the gate of the third pull-down transistor, the drain of the third pull-up transistor is connected to the drain of the third pull-down transistor.

16. The computing-in-memory chip according to claim 13, further comprising a digital combined circuit, wherein the input terminal of the digital combined circuit is connected to the output terminal of the third inverter, configured to convert the digital signal to a target encoding.

17. The computing-in-memory chip according to claim 9, further comprising an address decoder, wherein the address decoder is connected between the signal input terminal and the resistive random access memory array.

* * * * *